(12) United States Patent
Yang et al.

(10) Patent No.: US 12,075,594 B2
(45) Date of Patent: *Aug. 27, 2024

(54) HEAT DISSIPATION STRUCTURE

(71) Applicants: Inventec (Pudong) Technology Corporation, Shanghai (CN); INVENTEC CORPORATION, Taipei (TW)

(72) Inventors: Tzu Shiou Yang, Taipei (TW); Chun Chi Lin, Taipei (TW)

(73) Assignees: Inventec (Pudong) Technology Corporation, Shanghai (CN); INVENTEC CORPORATION, Taipei (TW)

( * ) Notice: Subject to any disclaimer, the term of this patent is extended or adjusted under 35 U.S.C. 154(b) by 151 days.

This patent is subject to a terminal disclaimer.

(21) Appl. No.: 17/823,944

(22) Filed: Aug. 31, 2022

(65) Prior Publication Data
US 2023/0397365 A1   Dec. 7, 2023

(30) Foreign Application Priority Data
Jun. 2, 2022   (CN) .......................... 202210623996.6

(51) Int. Cl.
*H05K 7/20* (2006.01)
*G06F 1/20* (2006.01)

(52) U.S. Cl.
CPC ......... *H05K 7/20154* (2013.01); *G06F 1/203* (2013.01); *H05K 7/20145* (2013.01); *H05K 7/2039* (2013.01)

(58) Field of Classification Search
CPC ...... G06F 1/203; G06F 2200/201; G06F 1/20; H05K 7/20154; H05K 7/20172; H05K 7/20136; H05K 7/20972; H05K 7/20509; H01L 23/467
See application file for complete search history.

(56) References Cited

U.S. PATENT DOCUMENTS

| | | | |
|---|---|---|---|
| 9,087,804 B2 * | 7/2015 | Wong | ........................ G06F 1/20 |
| 10,423,200 B1 | 9/2019 | North et al. | |
| 10,969,838 B2 | 4/2021 | He et al. | |
| (Continued) | | | |

FOREIGN PATENT DOCUMENTS

| | | |
|---|---|---|
| EP | 1621970 A2 | 2/2006 |
| TW | M502876 U | 6/2015 |
| (Continued) | | |

*Primary Examiner* — Mandeep S Buttar
(74) *Attorney, Agent, or Firm* — CKC & Partners Co., LLC (57) ABSTRACT

A heat dissipation device includes a housing, a heat dissipation plate, a first fan and at least two second fans. The housing has a first sidewall and a second sidewall that are opposite to each other. The first sidewall has a first opening area and the second sidewall has a second opening area which is facing the first opening area. The heat dissipation plate is located inside the housing and covers at least one heat source. An opening that corresponds to the first opening area and contains the first fan penetrates through the heat dissipation plate. Each of the at least two second fans that include airflow exits facing away from the first fan is located nearby the heat dissipation plate. The housing includes side surfaces that connect the first sidewall and the second sidewall and have three side opening areas that are facing different directions.

16 Claims, 6 Drawing Sheets

(56) References Cited

U.S. PATENT DOCUMENTS

| | | | |
|---|---|---|---|
| 11,016,529 B1 | 5/2021 | Tucker et al. | |
| 11,775,034 B2 * | 10/2023 | Chen | H05K 7/20163 |
| | | | 361/679.46 |
| 11,877,381 B2 | 1/2024 | Cheng et al. | |
| 2006/0196639 A1 | 9/2006 | Yang et al. | |
| 2006/0196643 A1 * | 9/2006 | Hata | H01L 23/473 |
| | | | 257/E23.098 |
| 2013/0327507 A1 * | 12/2013 | Degner | H05K 7/2039 |
| | | | 361/695 |
| 2015/0116928 A1 | 4/2015 | Delano et al. | |
| 2017/0153677 A1 * | 6/2017 | Cheng | G06F 1/1637 |
| 2019/0050031 A1 | 2/2019 | Utz et al. | |
| 2020/0128692 A1 * | 4/2020 | Singh | G06F 1/203 |
| 2020/0396864 A1 | 12/2020 | Ku et al. | |
| 2021/0149463 A1 | 5/2021 | Lu et al. | |
| 2022/0302757 A1 | 9/2022 | Pei et al. | |
| 2022/0400582 A1 | 12/2022 | Lin et al. | |
| 2023/0066801 A1 * | 3/2023 | Lin | G06F 1/1656 |
| 2023/0397362 A1 | 12/2023 | Yang et al. | |
| 2023/0397363 A1 | 12/2023 | Cheng et al. | |
| 2023/0397364 A1 | 12/2023 | Cheng et al. | |
| 2023/0397365 A1 * | 12/2023 | Yang | H05K 7/2039 |
| 2023/0422446 A1 * | 12/2023 | Hashiba | H05K 7/20336 |

FOREIGN PATENT DOCUMENTS

| | | |
|---|---|---|
| TW | 201925954 A | 7/2019 |
| TW | 202131783 A | 8/2021 |
| TW | M620617 U | 12/2021 |
| TW | I763256 B | 5/2022 |

\* cited by examiner

HEAT DISSIPATION STRUCTURE

CROSS-REFERENCE TO RELATED APPLICATION

This application claims priority to China Application Serial Number 202210623996.6, filed Jun. 2, 2022, which is herein incorporated by reference in its entirety.

BACKGROUND

Field of Invention

The present invention relates to a heat dissipation structure.

Description of Related Art

Air-cooled heat dissipation structures for commercial laptops are typically designed with dual fans. The configuration of the heat dissipation structures are set heat pipes around the heating elements, and through thermal conduction, the heat pipes will transfer the heat to the cooling fans, the heat then will be brought out of the laptop. However, the heating elements (e.g. CPU chips, GPU chips) are often arranged closely because of space limitations. Therefore, heats will build up in certain positions inside the laptop, which is unfavorable for heat dissipation. Moreover, the air entrance of the fan sucks cold air through a single side of the laptop (often from the bottom of the laptop), so that a limited amount of space for drawing cold air will cause poor heat dissipation for the laptops.

SUMMARY

An aspect of the present disclosure is related to a heat dissipation structure.

According to one embodiment of the present disclosure, a heat dissipation structure includes a housing, a heat dissipation plate, a first fan, and at least two second fans. The housing has a first sidewall and a second sidewall opposite to each other. The first opening area is located on the first sidewall. The second opening area is located on the second sidewall. The first opening area and the second opening area are opposite to each other. The heat dissipation plate is located inside the housing and covers at least one heat source. The heat dissipation plate has an opening penetrate through the heat dissipation plate. The opening corresponds to the first opening area. The first fan is located inside the opening. The at least two second fans are located near the heat dissipation plate. Each of the airflow exits of the at least two second fans are facing away from the first fan. The housing further includes side surfaces connecting the first sidewall and the second sidewall. The side surfaces include three side opening areas. The three side opening areas are facing different directions.

In an embodiment of the present disclosure, the heat dissipation plate includes thermal conducted components that extend along the heat dissipation plate and pass through the airflow exits of the at least two second fans.

In an embodiment of the present disclosure, the three side opening areas include a first side opening area that is located nearby the first fan and on a side of the heat dissipation plate.

In an embodiment of the present disclosure, the housing further includes at least one bracket. The at least one bracket is located nearby the first side opening area and on the second sidewall. The at least one bracket separates an airflow exits from the first side opening area from the second opening area.

In an embodiment of the present disclosure, when the at least one bracket is unfolded, a height of a side of the housing is increased.

In an embodiment of the present disclosure, thermal exchangers are located between the first side opening area and the first fan.

In an embodiment of the present disclosure, the three side opening areas further include two second side opening areas which are corresponding to the airflow exits of the at least two second fans. The heat dissipation plate includes thermal conducted components that are extended from the heat dissipation plate and located between the airflow exits and the two second side opening areas.

In an embodiment of the present disclosure, thermal exchangers are located between the two second side opening areas and the at least two second fans.

In an embodiment of the present disclosure, the first side opening area is facing a first direction, and the two second side opening areas are facing a second direction and a third direction which are opposite to each other respectively.

In an embodiment of the present disclosure, the at least one heat source is plural, and the opening separates these heat sources.

In an embodiment of the present disclosure, the housing includes third opening areas and fourth opening areas that are located on the first sidewall and the second sidewall respectively. The third opening areas and the fourth opening areas are corresponded to the at least two second fans.

In an embodiment of the present disclosure, the housing further includes blocks that are located on the second sidewall. Each of the blocks are located between the airflow exits of the at least two second fans and the fourth opening areas respectively.

In an embodiment of the present disclosure, the heat dissipation structure further includes first baffles which separate a side of each of the at least two second fans nearby the heat dissipation plate from the heat dissipation plate.

In an embodiment of the present disclosure, the first baffles are located inside the housing and connect to one of the second sidewall and the first sidewall.

In an embodiment of the present disclosure, the first baffles are located on edges of the at least two second fans. The edges are connected to one of the first sidewall and the second sidewall through the first baffles.

In an embodiment of the present disclosure, the at least two second fans include second baffles which partially surround airflow entrances of the at least two second fans.

According to the above paragraphs, in the heat dissipation structure of the present disclosure, by setting the airflow exits of the first fan and the two second fans in different directions, the heat will be transferred in different directions and being brought to the outside of the housing. In addition, the large surface heat dissipation plate, the extended thermal conducted components and multiple thermal exchangers that are included in the heat dissipation structure may improve the dissipation area. In the meanwhile, the heat dissipation structure also distributed the heat sources on the heat dissipation plate evenly to prevent heat stacking on a certain location. On the other hand, the heat dissipation structure has arranged multiple opening areas on the first side wall and the second sidewall, which the opening areas are corresponded to the airflow entrances of the fan. This may help the fan to such cool air from both sides, and upgrade the amount of cool air that may be sucked in by the fan.

Moreover, the heat dissipation structure sets brackets and blocks between the airflow exits and the airflow entrances, which may prevent the exited hot air being sucked back into the housing again. Convective field of every fans are independent which make sure that the heat dissipation path is smooth, and the unwanted airflow between the fans will not appear. Further, the first baffles separate the uniform hot region and the dissipation regions, and the second baffles that partially surround the airflow entrances of the two second fans may separate it from the interior of the housing. As a result, the path of the convection field may be controlled, which prevents unwanted airflow between the fans during the operation.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiment, with reference made to the accompanying drawings as follows.

DETAILED DESCRIPTION

Reference will now be made in detail to the present embodiments of the invention, examples of which are illustrated in the accompanying drawings. Wherever possible, the same reference numbers are used in the drawings and the description to refer to the same or like parts.

Spatially relative terms, such as "beneath," "below," "lower," "above," "upper," "front," "back" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 1:
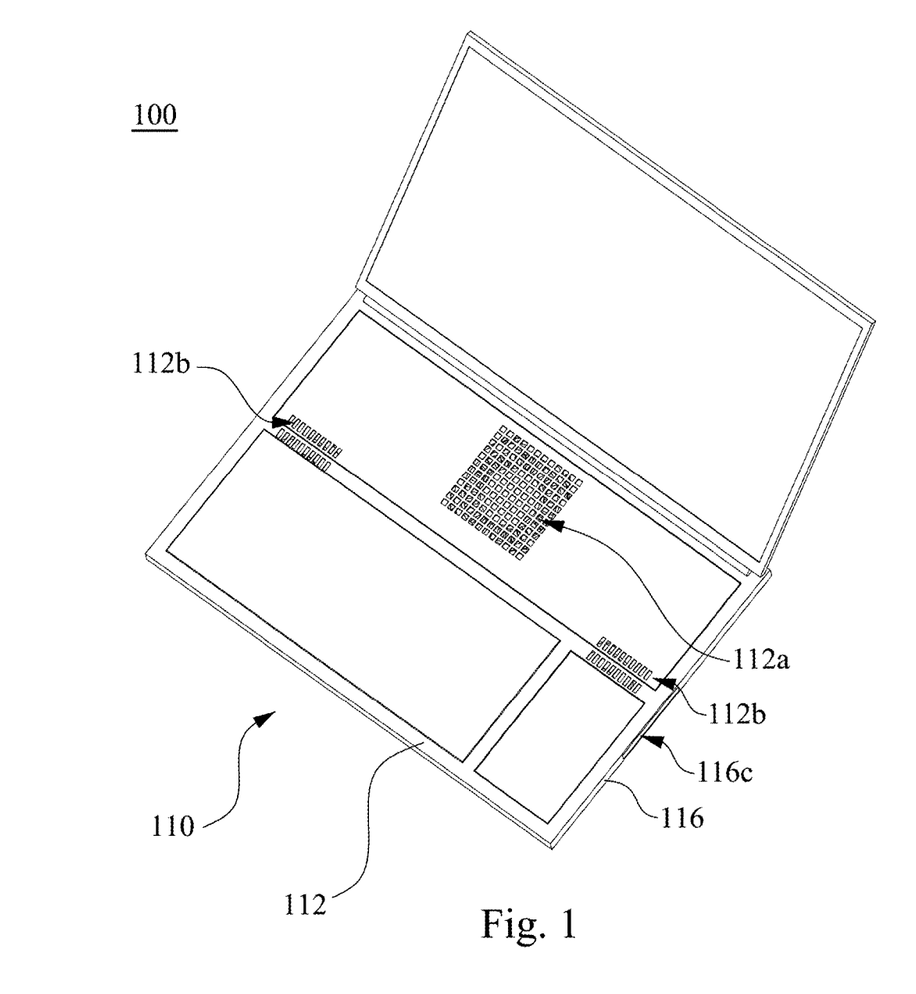
FIG. 1 schematically illustrates a top view of a heat dissipation structure, according to one embodiment of the present disclosure.
Figure 2:
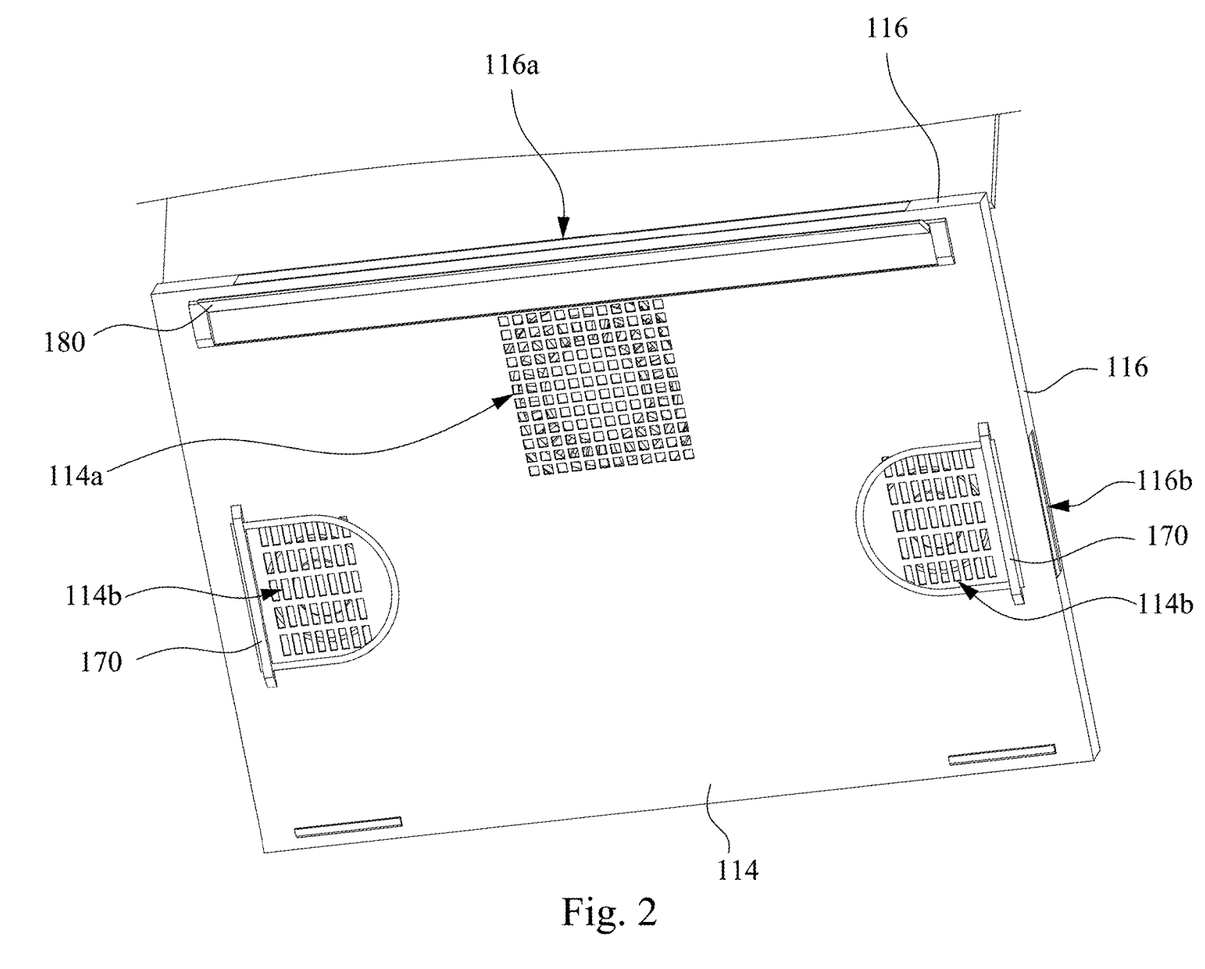
FIG. 2 schematically illustrates a back view of a heat dissipation structure, according to one embodiment of the present disclosure.
Figure 3A:
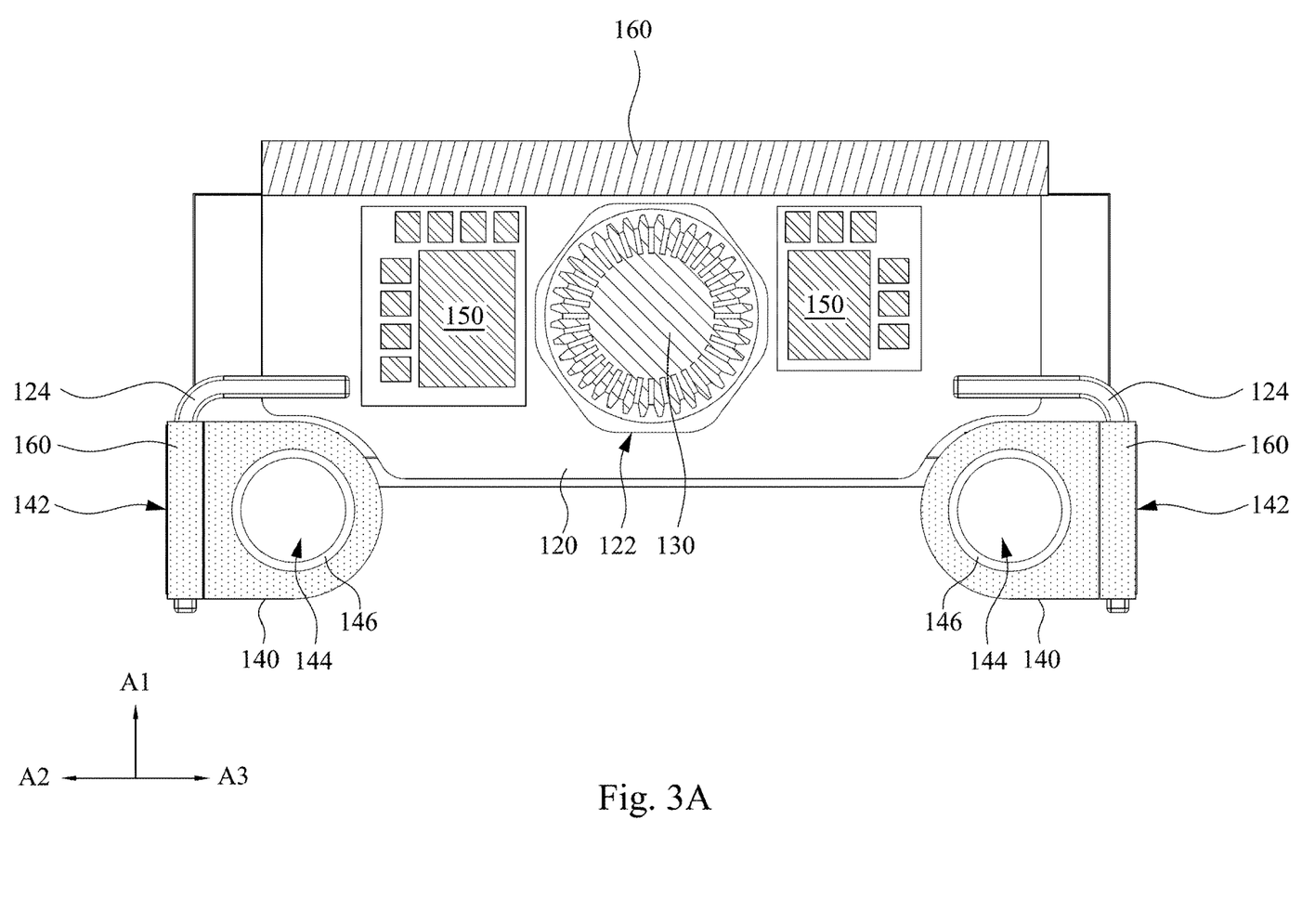
FIG. 3A schematically illustrates a sectional view of a part of a heat dissipation structure inside the housing, according to one embodiment of the present disclosure.

FIG. 1 schematically illustrates a top view of a heat dissipation structure 100, according to one embodiment of the present disclosure. FIG. 2 schematically illustrates a back view of a heat dissipation structure 100, according to one embodiment of the present disclosure. FIG. 3A schematically illustrates a sectional view of a part of a heat dissipation structure 100 inside the housing 110, according to one embodiment of the present disclosure. References are made to FIG. 1 to FIG. 3A, according to one embodiment of the present disclosure, a heat dissipation structure 100 includes a housing 110, a heat dissipation plate 120, a first fan 130, and at least two second fans 140. The housing 110 has a first sidewall 112 and a second sidewall 114 opposite to each other. The first opening area 112a is located on the first sidewall 112. The second opening area 114a is located on the second sidewall 114. The first opening area 112a and the second opening area 114a are opposite to each other. The heat dissipation plate 120 is located inside the housing 110 and covers at least one heat source 150. The heat dissipation plate 120 has an opening 122 penetrate through the heat dissipation plate 120. The opening 122 corresponds to the first opening area 112a. The first fan 130 is located inside the opening 122. The at least two second fans 140 are located near the heat dissipation plate 120. Each of the airflow exits 142 of the at least two second fans 140 are facing away from the first fan 130. The housing 110 further includes side surfaces 116 connecting the first sidewall 112 and the second sidewall 114. The side surfaces 116 include three side opening areas 116a, 116b, 116c. The three side opening areas 116a, 116b, 116c are facing different directions. References are made to FIG. 1 to FIG. 2, in some embodiments, the first sidewall 112, the second sidewall 114 and the side surfaces 116 of the housing 110 may define an accommodation space to accommodate a part of the heat dissipation structure 100. However, the housing 2110 may be a part of other devices, such as a computer, a processor. On the other hand, the accommodation space may also include other electronic components or devices, such as, a keyboard, a touch pad, a stylus etc., that are not included in the heat dissipation structure 100. For example, in the embodiment that is shown in FIG. 1 and FIG. 2, the housing 110 is combined with a laptop. Except from the heat dissipation structure 100, the housing 110 may further includes processors, circuit boards, input devices and input/output interfaces.

Figure 3B:
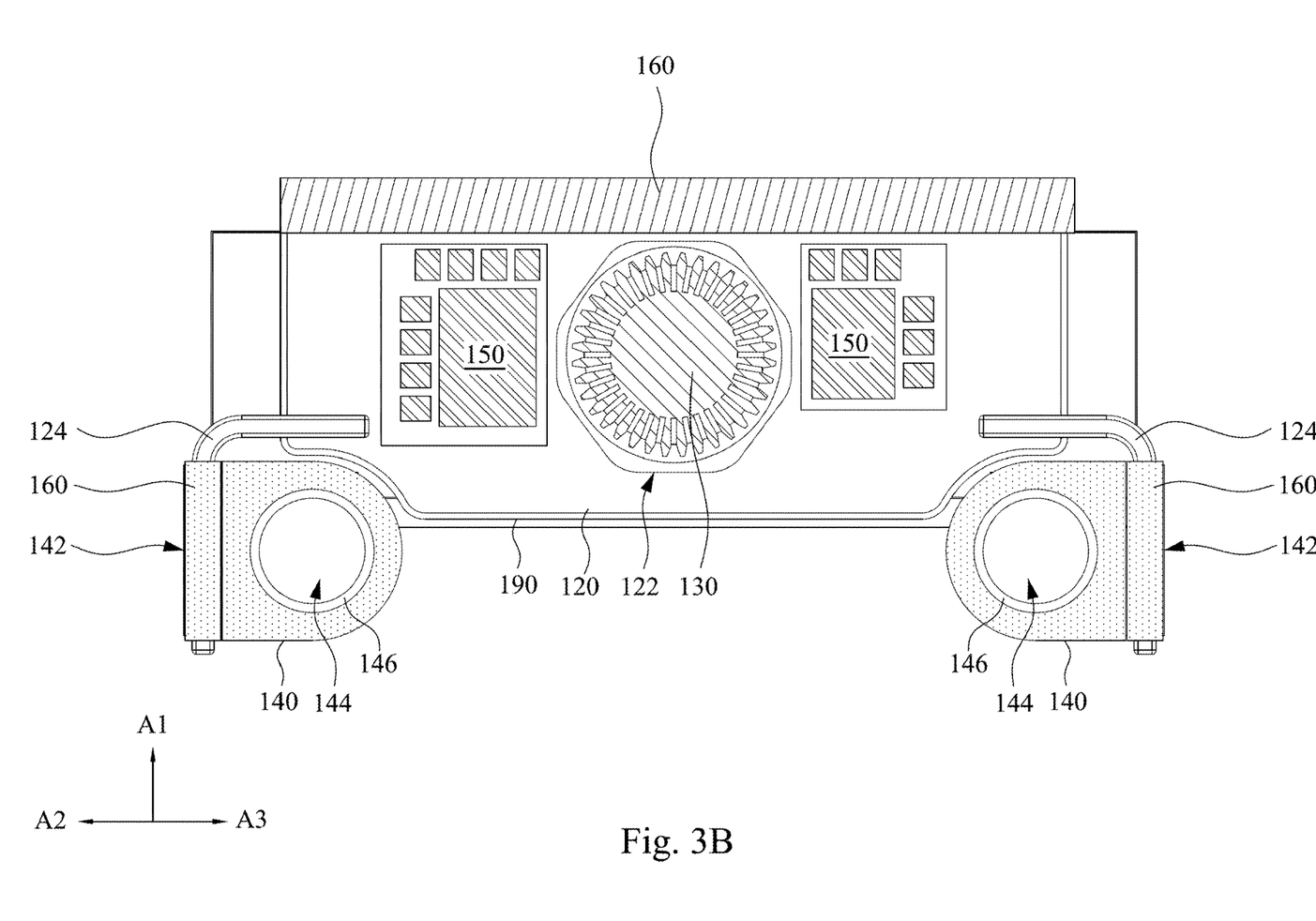
FIG. 3B schematically illustrates a sectional view of a part of a heat dissipation structure inside the housing, according to another embodiment of the present disclosure.
Figure 3C:
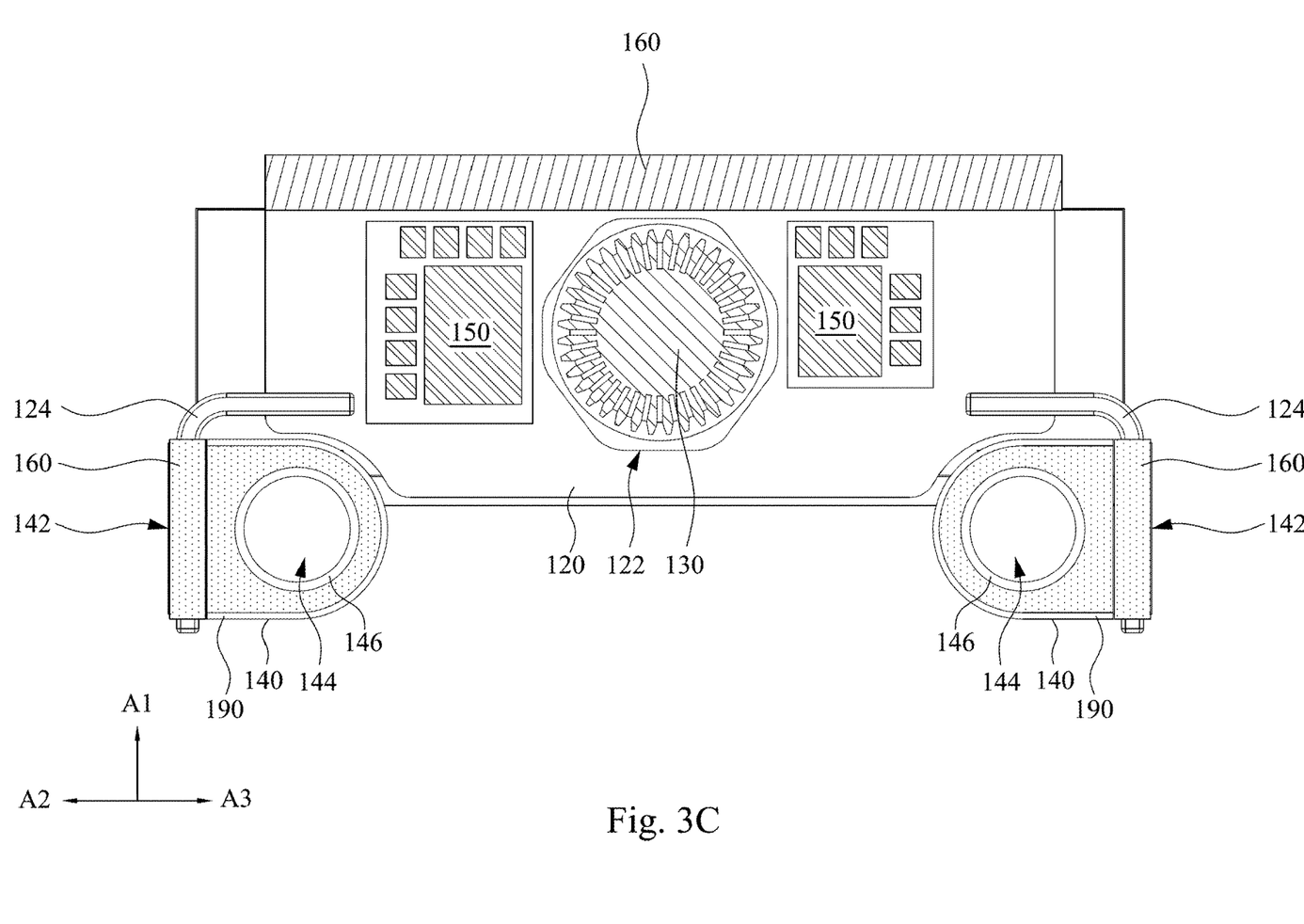
FIG. 3C schematically illustrates a sectional view of a part of a heat dissipation structure inside the housing, according to another embodiment of the present disclosure.
Figure 4:
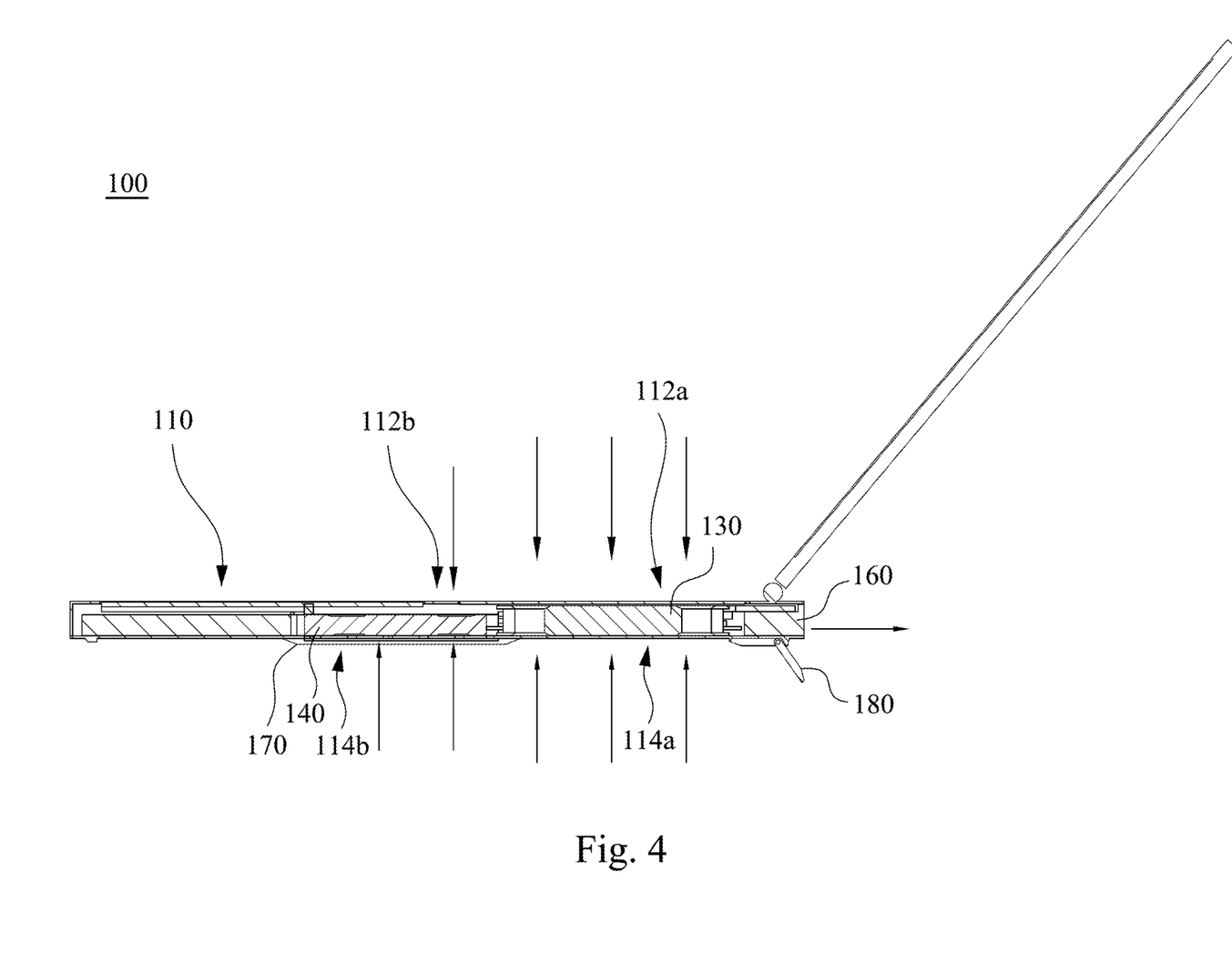
FIG. 4 schematically illustrates a sectional view of a heat dissipation structure, according to one embodiment of the present disclosure.

FIG. 4 schematically illustrates a sectional view of a heat dissipation structure 100, according to one embodiment of the present disclosure. References are made to FIG. 1 to FIG. 4, the first sidewall 112 and the second sidewall 114 are opposite to each other and have a first opening area 112a and a second opening area 114a respectively. In some embodiments, the first opening area 112a and the second opening area 114a may include arbitrary numbers of openings. When the first opening area 112a and the second opening area 114a are corresponding to each other, these openings do not have to face each other correspondingly. When the first opening area 112a and the second opening area 114a are corresponding to each other, airflows may flow into the housing 110 from the first opening area 112a and flow out of the housing 110 through the second opening area 114a, similarly, the airflows may move in the opposite direction. In some embodiments, the housing 110 includes third opening areas 112b and fourth opening areas 114b that are located on the first sidewall 112 and the second sidewall 114 respectively. The third opening areas 112b and the fourth opening areas 114b are corresponded to the at least two second fans 140. In some embodiments, the third opening areas 112b and the fourth opening areas 114b may be located nearby the airflow entrances 144 of the at least two second fans 140, and thus assist the at least two second fans 140 to suck in the cool air outside the housing 110. For example, the third opening areas 112b are located on the first sidewall 112, where the third opening areas 112b are corresponding to the at least two second fans 140. The fourth opening areas 114b are located on the second sidewall 114, where the fourth opening areas 114b are corresponding to the at least two second fans 140. In some embodiments, the third opening areas 112b and the fourth opening areas 114b may include arbitrary numbers of openings, but the present disclosure is not limited to this.

References are made to FIG. 1 to FIG. 4, in some embodiments, side surfaces 116 are connected to the edges of the first sidewall 112 and the second sidewall 114, and every side surfaces 116 are facing different directions. The side surfaces 116 include three side opening areas 116a, 116b, 116c. According to their locations, the three side opening areas 116a, 116b, 116c may be separated into a first side opening area 116a which is next to the first fan 130, and two second side opening areas 116b, 116c which are next to the at least two second fans 140 respectively. In some embodiments, the first side opening area 116a and the two second side opening areas 116b, 116c may act as airflow exits, which help the air moving out of the housing 110 in different directions. The locations of the first side opening area 116a and the two second side opening areas 116b, 116c may according to the location of the heat dissipation plate 120, the first fan 130 and the at least two second fans 140. The relations between them may be discussing in the following paragraphs.

References are made to FIG. 1 to FIG. 3A. The heat dissipation plate 120 is located inside the accommodation space, and covers the heat source(s) 150. In some embodiments, the heat source(s) 150 may be CPU, GPU or other kinds of heating electronic components. The heat dissipation plate 120 has opening 122 and contains the first fan 130. Specifically, the location of the first fan 130 (also the location of the opening 122) is corresponding to the first opening area 112a and the second opening area 114a. The first opening area 112a and the second opening area 114a may assist the first fan 130 to suck in the cool air outside the housing 110. In some embodiments, the opening 122 of the heat dissipation plate 120 is located at the center of the heat dissipation plate 120. As a result, the first fan 130 that is located inside the opening 122 may be in the center of the heat dissipation plate 120. The first fan 130 may bring the heat of the heat source(s) 150 along directions that are radially away from the first fan 130 to other locations of the heat dissipation plate 120 through the airflows, and thus enhance the dissipation rate of the heat dissipation plate 120. In other embodiments, the heat source 150 is plural, and the opening separates these heat sources 150. For example, reference is made to FIG. 3A. The heat sources 150 are located at two sides of the opening 122 respectively. By separates the heat sources 150 on two sides of the first fan 130 (which where the opening 122 in located), the heat generated by the heat sources may be separated. As a result, the heat may distribute on the heat dissipation plate 120 more on averagely, and thus the dissipation efficiency may be upgraded.

References are made to FIG. 1 to FIG. 3A. In some embodiments, the first side opening area 116a is located nearby the first fan 130 and on a side of the heat dissipation plate 120. Moreover, in the embodiments shown in FIG. 3A, thermal exchangers 160 are located between the first side opening area 116a and the first fan 130. As a result, the first fan 130 may assist the heat to conduct on the heat dissipation plate 120. In the meanwhile, the airflow may bring the heat towards the thermal exchangers 160 and exits the housing 110 from the first side opening area 116a. The thermal exchangers 160 may offer a larger surface area for the heat to conduct with the airflow, and improve the efficiency of the airflow which brings the heat out of the housing 110.

References are made to FIG. 1 to FIG. 3A, in some embodiments, the heat dissipation plate 120 includes thermal conducted components 124 that extend along the heat dissipation plate 120 and pass through the airflow exits 142 of the at least two second fans 140. Having thermal conducted components 124 may extend the conduction path of the heat dissipation plate 120 to a certain location, and thus improve the dissipation rate of the heat dissipation plate 120. For example, reference is made to FIG. 3A, two thermal conducted components 124 are extended separately along the heat dissipation plate 120 to the airflow exits 142 of the at least two second fans 140. Furthermore, in some embodiments, the two second side opening areas 116b, 116c are arranged correspond to the airflow exits 142. The thermal conducted components 124 are extended from the heat dissipation plate 120 and located between the airflow exits 142 and the two second side opening areas 116b, 116c respectively. As a result, the heat transferred by the thermal conducted components 124 may move towards the airflow exits 142 in a more precise way and thus being brought out of the housing 110 by the airflow of the at least two second fans 140. In some embodiments, thermal exchangers 160 are located between the two second side opening areas 116b, 116c and the at least two second fans 140. Specifically, the thermal conducted components 124 and the thermal exchangers 160 may connect to each other to improve the dissipation surface. By setting the thermal exchangers 160 next to the airflow exits 142, the heat may be brought out of the housing 110 by the airflow through passing the two second opening areas 116b, 116c.

It should be understand that the design of the heat dissipation structure 100 may reduce and avoid unwanted airflow flows between the fans of the heat dissipation structure 100 (e.g., the heat transferred between the first fan 130 and the at least two second fans 140.) The principle to reduce these kinds of airflows is by setting different directions of each airflow exits 142 (e.g. the two second side opening areas 116b, 116c) of the at least two second fans 140 of the heat dissipation structure 100. As a result, one may avoid the hot air exits out of the housing 110 by one of the airflow exits (e.g. the side opening areas 116a, 116b, 116c) of a fan being suck back into the housing 110 through another airflow entrances (e.g. the first opening areas 112a, the second opening area 114a, the third opening areas 112b and the fourth opening areas 114b.) For example, in the embodiment shown in FIG. 1 to FIG. 3A, the first side opening area 116a is facing a first direction A1, and the two second side opening areas 116b, 116c are facing a second direction A2 and a third direction A3 which are opposite to each other respectively.

References are made to FIG. 1 to FIG. 3A, in some embodiments, the housing 110 further includes blocks 170 that are located on the second sidewall 114. Each of the blocks 170 are located between the airflow exits 142 of the at least two second fans 140 (which corresponds to the two second side opening areas 116b, 116c respectively) and the fourth opening areas 114b respectively. Specifically, the fourth opening areas 114b corresponds to the airflow exits 142 of the at least two second fans 140. By setting the blocks 170 between the airflow exits 142 and the airflow entrances 144, the blocks 170 may separate the hot air exits from the airflow exits 142 to flow back to the airflow entrances 144, and thus avoid unwanted airflow flows. In some embodiments, the housing 110 further includes at least one bracket 180. The at least one bracket 180 is located nearby the first side opening area 116a and on the second sidewall 114. The at least one bracket 180 separates an airflow exits from the first side opening area 116a from the second opening area 114a. Specifically, the at least one bracket 180 may located between the first side opening area 116a from the second opening area 114a. When the at least one bracket 180 is unfolded, a wall may form between the first side opening area 116a and on the second sidewall 114, and thus separates the hot air exits from the first side opening area 116a flowing back to the second sidewall 114. In addition, when the at least one bracket 180 is unfolded, a height of a side of the housing 110 is increased, thus increase the cool air space for the second opening area 114a to suck more cool air inside the housing 110 by the first fan 130.

FIG. 3B schematically illustrates a sectional view of a part of a heat dissipation structure 100 inside the housing, according to another embodiment of the present disclosure. References are made to FIG. 1, FIG. 2 and FIG. 3B, in some embodiments, the heat dissipation structure 100 further includes first baffles 190 which separate a side of each of the at least two second fans 140 nearby the heat dissipation plate 120 from the heat dissipation plate 120. Specifically, setting the first baffles 190 may separate the space inside the housing 110, and improve the dissipation rate of the heat dissipation structure 100. Setting the first baffles 190 between the at least two second fans 140 and the heat dissipation plate 120 may prevent the at least two second fans 140 sucking in the hot air coming from the heat dissipation plate 120. The first baffles 190 separate the heat dissipation plate 120 and the first fan 130 as a uniform hot region. In this uniform hot region, the heat from the heat sources 150 are evenly distributed to prevent heat stacking, and thus improve dissipation rate. On the other hand, in the meanwhile, the first baffles 190 separate the at least two second fans 140 as dissipation regions respectively. The may form thermal conduction path by the thermal conducted components 124, which may carry the heat from the uniform hot region to the dissipation regions. As a result, the cool air sucked by the at least two second fans 140 may focus on helping the thermal conducted components 124 to dissipate heat. In addition, the first baffles 190 may confirm the cool airflow of the at least two second fans 140 will not create unwanted airflow between the uniform hot region and the dissipation regions.

FIG. 3C schematically illustrates a sectional view of a part of a heat dissipation structure 100 inside the housing, according to another embodiment of the present disclosure. References are made to FIG. 1, FIG. 2, and FIG. 3C, in some embodiments, the first baffles 190 are located inside the housing 110 and connect to one of the second sidewall 114 and the first sidewall 112. Specifically, the first baffles 190 may located between the second sidewall 114 and the first sidewall 112, and surround the uniform hot region. The first baffles 190 may be walls extended from one of the second sidewall 114 and the first sidewall 112. The uniform hot region separated by the first baffles 190 includes the first fan 130 and the heat dissipation plate 120. In some embodiments, the uniform hot region may contain other components or a part of other components, such as circuit boards or other electronic devices. Moreover, the first baffles 190 also separate the at least two second fans 140 as two dissipation regions. In some embodiments, the two dissipation regions are not connected, and both of the two dissipation regions are connected to the heat dissipation plate 120 in the uniform hot region by the thermal conducted components 124. As a result, every dissipation regions are independent to each other, and therefore the heat dissipation rate of the heat dissipation structure 100 is being improved. In some other embodiments, the first baffles 190 is located on the edges of the at least two second fans 140. The edges are connected to one of the first sidewall 112 and the second sidewall 114 through the first baffles 190. Specifically, setting the first baffles 190 on the edges of the at least two second fans 140 also may achieve the goal for separating the uniform hot region and the dissipation regions.

References are made to FIG. 1, FIG. 2, and FIG. 3A, in some embodiments, the at least two second fans 140 include second baffles 146 which partially surround airflow entrances 144 of the at least two second fans 140. Setting the second baffles 146 around the airflow entrances 144 may prevent the cool air of the at least two second fans 140 is entered from the outside of the housing 110. As a result, the airflow entrances 144 only will accept the cool air from the outside, and will not interact with the hot airflow inside the housing 110.

According to the above paragraphs, in the heat dissipation structure of the present disclosure, by setting the airflow exits of the first fan and the two second fans in different directions, the heat will be transferred in different directions and being brought to the outside of the housing. In addition, the large surface heat dissipation plate, the extended thermal conducted components and multiple thermal exchangers that are included in the heat dissipation structure may improve the dissipation area. In the meanwhile, the heat dissipation structure also distributed the heat sources on the heat dissipation plate evenly to prevent heat stacking on a certain location. On the other hand, the heat dissipation structure has arranged multiple opening areas on the first side wall and the second sidewall, which the opening areas are corresponded to the airflow entrances of the fan. This may help the fan to such cool air from both sides, and upgrade the amount of cool air that may be sucked in by the fan. Moreover, the heat dissipation structure sets brackets and blocks between the airflow exits and the airflow entrances, which may prevent the exited hot air being sucked back into the housing again. Convective field of every fans are independent which make sure that the heat dissipation path is smooth, and the unwanted airflow between the fans will not appear. Further, the first baffles separate the uniform hot region and the dissipation regions, and the second baffles that partially surround the airflow entrances of the two second fans may separate it from the interior of the housing. As a result, the path of the convection field may be controlled, which prevents unwanted airflow between the fans during the operation.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:
1. A heat dissipation structure, comprising:
a housing having a first sidewall and a second sidewall opposite to each other, a first opening area being disposed on the first sidewall, a second opening area being disposed on the second sidewall, the first opening area and the second opening area being opposite to each other;

a heat dissipation plate disposed inside the housing and covering at least one heat source, the heat dissipation plate having an opening penetrates through the heat dissipation plate, the opening corresponding to the first opening area;

a first fan disposed inside the opening; and at least two second fans disposed near the heat dissipation plate, each of airflow exits respectively of the at least two second fans facing away from the first fan, wherein the housing further comprises a plurality of side surfaces connecting the first sidewall and the second sidewall, the side surfaces comprise three side opening areas, and the three side opening areas are facing different directions.

2. The heat dissipation structure of claim 1, wherein the heat dissipation plate comprises a plurality of thermal conducted components that extend along the heat dissipation plate and pass through the airflow exits of the at least two second fans.

3. The heat dissipation structure of claim 1, wherein the three side opening areas comprise a first side opening area that is disposed nearby the first fan and on a side of the heat dissipation plate.

4. The heat dissipation structure of claim 3, wherein the housing further comprises at least one bracket, the at least one bracket is disposed nearby the first side opening area and on the second sidewall, and the at least one bracket separates an airflow exiting from the first side opening area.

5. The heat dissipation structure of claim 4, wherein when the at least one bracket is unfolded, a height of a side of the housing is increased.

6. The heat dissipation structure of claim 3, further comprising a plurality of thermal exchangers disposed between the first side opening area and the first fan.

7. The heat dissipation structure of claim 3, wherein the three side opening areas further comprise two second side opening areas which are corresponding to the airflow exits of the at least two second fans, and the heat dissipation plate comprises a plurality of thermal conducted components that are extended from the heat dissipation plate and disposed between the airflow exits and the two second side opening areas.

8. The heat dissipation structure of claim 7, wherein a plurality of thermal exchangers are disposed between the two second side opening areas and the at least two second fans.

9. The heat dissipation structure of claim 7, wherein the first side opening area is facing a first direction, and the two second side opening areas are respectively facing a second direction and a third direction which are opposite to each other.

10. The heat dissipation structure of claim 1, wherein the at least one heat source is plural, and the opening separates the heat sources.

11. The heat dissipation structure of claim 1, wherein the housing comprises a plurality of third opening areas and a plurality of fourth opening areas that are disposed on the first sidewall and the second sidewall respectively, and the third opening areas and the fourth opening areas are corresponded to the at least two second fans.

12. The heat dissipation structure of claim 11, wherein the housing further comprises a plurality of blocks that are disposed on the second sidewall, and each of the blocks are disposed between the airflow exits of the at least two second fans and the fourth opening areas respectively.

13. The heat dissipation structure of claim 1, further comprising a plurality of first baffles which separate the at least two second fans from the heat dissipation plate.

14. The heat dissipation structure of claim 13, wherein the first baffles are disposed inside the housing and connect to one of the second sidewall and the first sidewall.

15. The heat dissipation structure of claim 13, wherein the first baffles are disposed on a plurality of edges of the at least two second fans, and the edges are connected to one of the first sidewall and the second sidewall through the first baffles.

16. The heat dissipation structure of claim 1, wherein the at least two second fans comprise a plurality of second baffles which partially surround a plurality of airflow entrances of the at least two second fans.

\* \* \* \* \*